US012593646B2

(12) United States Patent
Gwinn

(10) Patent No.: US 12,593,646 B2
(45) Date of Patent: Mar. 31, 2026

(54) AUTOMATED FAULT DETECTION IN MICROFABRICATION

(71) Applicant: TEL Manufacturing and Engineering of America, Inc., Chaska, MN (US)

(72) Inventor: Matthew Gwinn, Winchendon, MA (US)

(73) Assignee: TEL Manufacturing and Engineering of America, Inc., Chaska, MN (US)

( * ) Notice: Subject to any disclaimer, the term of this patent is extended or adjusted under 35 U.S.C. 154(b) by 670 days.

(21) Appl. No.: 17/454,449

(22) Filed: Nov. 10, 2021

(65) Prior Publication Data

US 2022/0351997 A1      Nov. 3, 2022

Related U.S. Application Data

(60) Provisional application No. 63/180,907, filed on Apr. 28, 2021.

(51) Int. Cl.
| | |
|---|---|
| *H01L 21/67* | (2006.01) |
| *G05B 23/02* | (2006.01) |
| *G06N 3/045* | (2023.01) |

(52) U.S. Cl.
CPC .... *H01L 21/67288* (2013.01); *G05B 23/0283* (2013.01); *G06N 3/045* (2023.01)

(58) Field of Classification Search
None
See application file for complete search history.

(56) References Cited

U.S. PATENT DOCUMENTS

| | | | |
|---|---|---|---|
| 5,859,964 | A | 1/1999 | Wang et al. |
| 7,660,774 | B2 | 2/2010 | Mukherjee et al. |
| 7,873,585 | B2 | 1/2011 | Izikson |
| 9,846,839 | B2 | 12/2017 | Nasle et al. |
| 10,916,472 | B2 | 2/2021 | Clark et al. |
| 2006/0259198 | A1 | 11/2006 | Brcka et al. |
| 2010/0106458 | A1 | 4/2010 | Leu et al. |
| 2019/0079503 | A1 | 3/2019 | Unterguggenberger et al. |
| 2019/0095797 | A1 | 3/2019 | Dhandapani et al. |
| 2019/0096723 | A1 | 3/2019 | Lin et al. |
| 2019/0148191 | A1 | 5/2019 | Wang et al. |

(Continued)

FOREIGN PATENT DOCUMENTS

| | | | |
|---|---|---|---|
| TW | 201941328 | A | 10/2019 |

OTHER PUBLICATIONS

International Search Report and Written Opinion, PCT Application No. PCT/US2022/024023, mailed Jul. 27, 2022, 10 pages.

(Continued)

*Primary Examiner* — Ryan A Jarrett
(74) *Attorney, Agent, or Firm* — Slater Matsil, LLP

(57) ABSTRACT

A method including: collecting first processing tool machine data from a first processing tool while treating semiconductor substrates, the first processing tool machine data including process data and operational codes associated with one or more discrete intervals of time during the treatments, training a first neural network with the first processing tool machine data from the first processing tool, and generating a first output indicative of a fault of the first processing tool from the first neural network, based, at least in part, on applying subsequent machine data from at least one processing tool.

20 Claims, 8 Drawing Sheets

(56) References Cited

U.S. PATENT DOCUMENTS

| | | | |
|---|---|---|---|
| 2019/0265657 A1 | 8/2019 | Inagaki et al. | |
| 2019/0286983 A1 | 9/2019 | Jung et al. | |
| 2020/0104639 A1* | 4/2020 | Didari ................... | G06N 3/045 |
| 2020/0226742 A1 | 7/2020 | Sawlani et al. | |
| 2021/0116896 A1* | 4/2021 | Arabshahi ............... | G06N 3/08 |

OTHER PUBLICATIONS

Wikipedia, "Supervised Learning," Accessed Jan. 21, 2021, 9 pages.
Korea Office Action, Patent Application No. 10-2023-7031451,
Mailed: Jul. 28, 2025, 17 Pages.
Taiwanese Search Report with English Translation, TW Patent
Application No. 111115788, mailed Jan. 7, 2026, 17 pages.

* cited by examiner

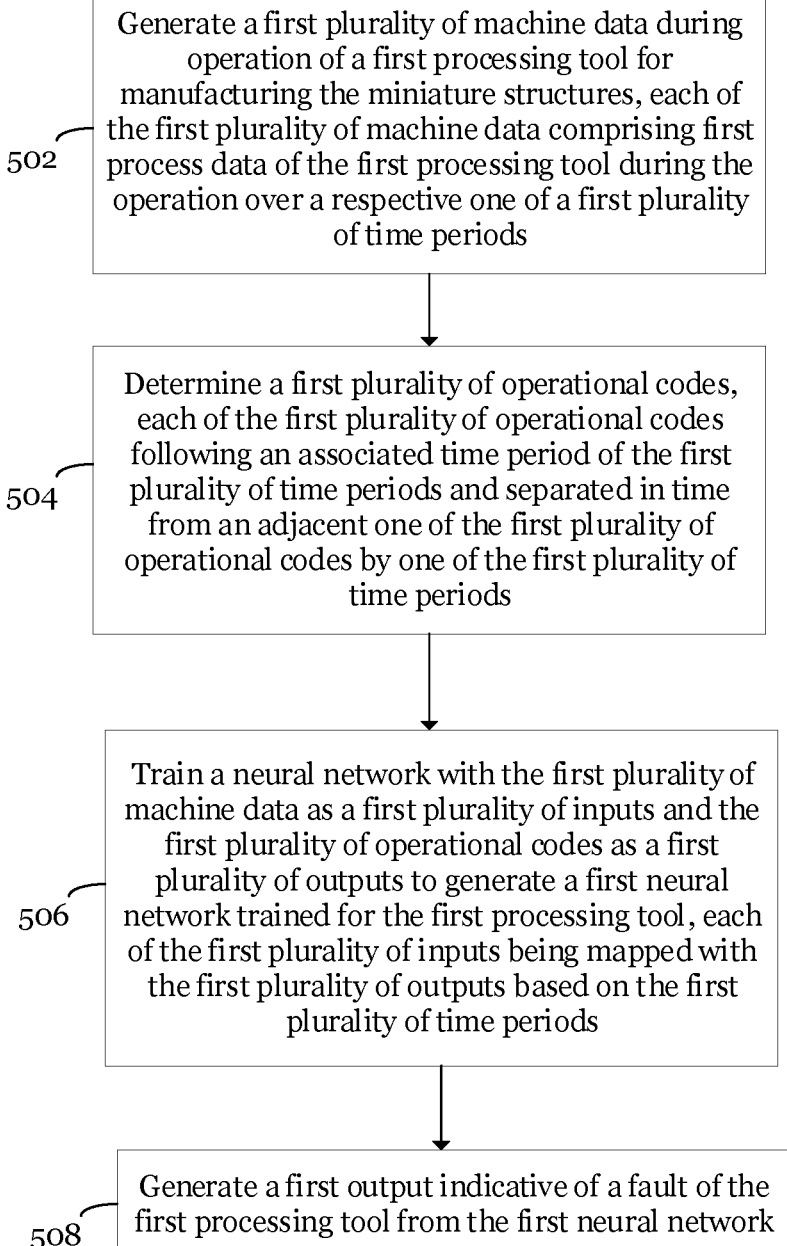

502  Generate a first plurality of machine data during operation of a first processing tool for manufacturing the miniature structures, each of the first plurality of machine data comprising first process data of the first processing tool during the operation over a respective one of a first plurality of time periods 504  Determine a first plurality of operational codes, each of the first plurality of operational codes following an associated time period of the first plurality of time periods and separated in time from an adjacent one of the first plurality of operational codes by one of the first plurality of time periods 506  Train a neural network with the first plurality of machine data as a first plurality of inputs and the first plurality of operational codes as a first plurality of outputs to generate a first neural network trained for the first processing tool, each of the first plurality of inputs being mapped with the first plurality of outputs based on the first plurality of time periods 508  Generate a first output indicative of a fault of the first processing tool from the first neural network

Fig. 5

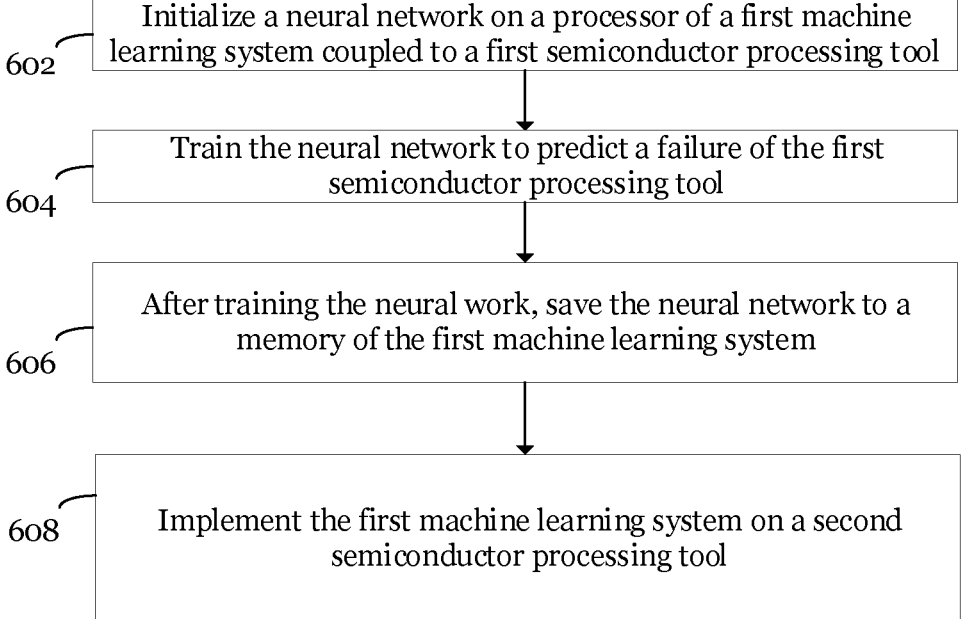

602 Initialize a neural network on a processor of a first machine learning system coupled to a first semiconductor processing tool 604 Train the neural network to predict a failure of the first semiconductor processing tool 606 After training the neural work, save the neural network to a memory of the first machine learning system 608 Implement the first machine learning system on a second semiconductor processing tool

Fig. 6

AUTOMATED FAULT DETECTION IN MICROFABRICATION

CROSS-REFERENCE TO RELATED APPLICATIONS

This application claims the benefit of U.S. Provisional Application No. 63/180,907 filed on Apr. 28, 2021 which application is hereby incorporated herein by reference.

TECHNICAL FIELD

The present invention relates generally to microfabrication techniques, and, in particular embodiments, to an automated fault detection in microfabrication.

BACKGROUND

Semiconductor device manufacturers face on going challenges to produce semiconductor devices at the smallest possible production cost and in the shortest amount of time. One way to reduce device production time and cost is to reduce semiconductor processing tool errors and faults. A fault of a semiconductor tool such as a reactive ion etch chamber or a robotic wafer track system may result in semiconductor wafer(s) that are processed with errors and have to be scrapped. This results in an increase in material cost, and thus, an increase in the overall production cost. Further, when a semiconductor tool fails or reaches a faulted state it may stop running wafers. This may result in temporary unscheduled semiconductor processing stoppages, and thus, an increase in semiconductor processing time.

SUMMARY

In accordance with an embodiment of the present application, a method comprises collecting first processing tool machine data from a first processing tool while treating semiconductor substrates, the first processing tool machine data including process data and operational codes associated with one or more discrete intervals of time during the treatments, training a first neural network with the first processing tool machine data from the first processing tool, and generating a first output indicative of a fault of the first processing tool from the first neural network, based, at least in part, on applying subsequent machine data from at least one processing tool.

In accordance with another embodiment of the invention, a tool system comprises a processor, a non-transitory memory coupled to the processor and including a program to be executed in the processor, the program including instructions for: collecting first processing tool machine data from a first processing tool while treating semiconductor substrates, the first processing tool machine data including process data and operational codes associated with one or more discrete intervals of time during the treatments, training a first neural network with the first processing tool machine data, and generating a first output indicative of a fault from the first neural network, based, at least in part, on applying subsequent machine data from at least one processing tool.

In accordance with another embodiment of the invention, a method comprises initializing a neural network on a processor of a first machine learning system coupled to a first semiconductor processing tool for processing wafers, training the neural network to predict a failure of the first semiconductor processing tool, after training the neural network, saving the neural network to a memory of the first machine learning system, and implementing the first machine learning system on a second semiconductor processing tool.

BRIEF DESCRIPTION OF THE DRAWINGS

For a more complete understanding of the present invention, and the advantages thereof, reference is now made to the following descriptions taken in conjunction with the accompanying drawings, in which:

FIG. 4A illustrates collected and accumulated machine data, and operational codes, FIG. 4B illustrates a first formatted machine data for use in the training phase, FIG. 4C illustrates a second formatted machine data for use in the training phase, FIG. 4D illustrates a first further formatted machine data for use in the use phase, and FIG. 4E illustrates a second further formatted machine data for use in the use phase;

FIG. 5 is a flow chart illustrating an example process flow used to train and use a neural network to a microfabrication tool fault in accordance with an embodiment of the present application;

FIG. 6 is a flow chart illustrating an example process flow used to implement a trained neural network onto an additional microfabrication tool to used to predict a fault state of the additional microfabrication tool in accordance with an embodiment of the present application;

DETAILED DESCRIPTION OF ILLUSTRATIVE EMBODIMENTS

The making and using of embodiments of this disclosure are discussed in detail below. It should be appreciated, however, that the concepts disclosed herein can be embodied in a wide variety of specific contexts, and that the specific embodiments discussed herein are merely illustrative and do not serve to limit the scope of the claims. Further, it should be understood that various changes, substitutions and alterations can be made herein without departing from the spirit and scope of this disclosure as defined by the appended claims. Although the present application is described in the context of semiconductor processing, embodiments of the present application are generally application to all microfabrication techniques for any manufacturing line for fabricating miniature structures on the scale of micrometers or less. Examples of such microfabrication techniques include integrated circuit fabrication, microelectromechanical systems (MEMS), microfluidics/lab-on-a-chip, optical MEMS, RF MEMS, PowerMEMS, BioMEMS, nano electro mechanical systems, and others.

Increases in material costs of semiconductor material due to wafer scrap caused by a semiconductor processing tool fault is a common issue associated with semiconductor processing. A semiconductor tool processing fault can lead to an improperly processed wafer(s) that may need to be scrapped, increasing production costs.

The inventor of this application has identified that one way to prevent wafer scrap is to predict a wafer processing fault using an artificial intelligence algorithm and stop/fix the wafer processing tool from running wafers before the error occurs. Generally, during microfabrication, semiconductor processing tools are continuously generating large quantities of complex data relating to the performance of the tool such as temperature, pressure, various currents and voltages, ratios of specific materials, and the like. Machine data such as tool performance data and measured in-situ tool data is continuously collected during processing. Even the slightest changes in a machine data variable can lead to a tool fault. Due to large quantities of data relating to the performance of the processing tool and the precision required for microfabrication, there are interrelationships between machine data variables that may lead to failures. However, the interrelationships between machine data variables may not fall into clear relationships that may be mathematically modeled so as to be able to predict an upcoming failure.

Embodiments described herein relate to a method and a system for predicting a microfabrication tool fault using an artificial intelligence (AI) based algorithm. The AI based algorithm is trained to understand the interrelationships between machine data variables and an upcoming failure. Based on such a trained AI based algorithm, failure of a tool may be foreseen and corrected before the tool misprocesses wafers.

Figures 1, 2:
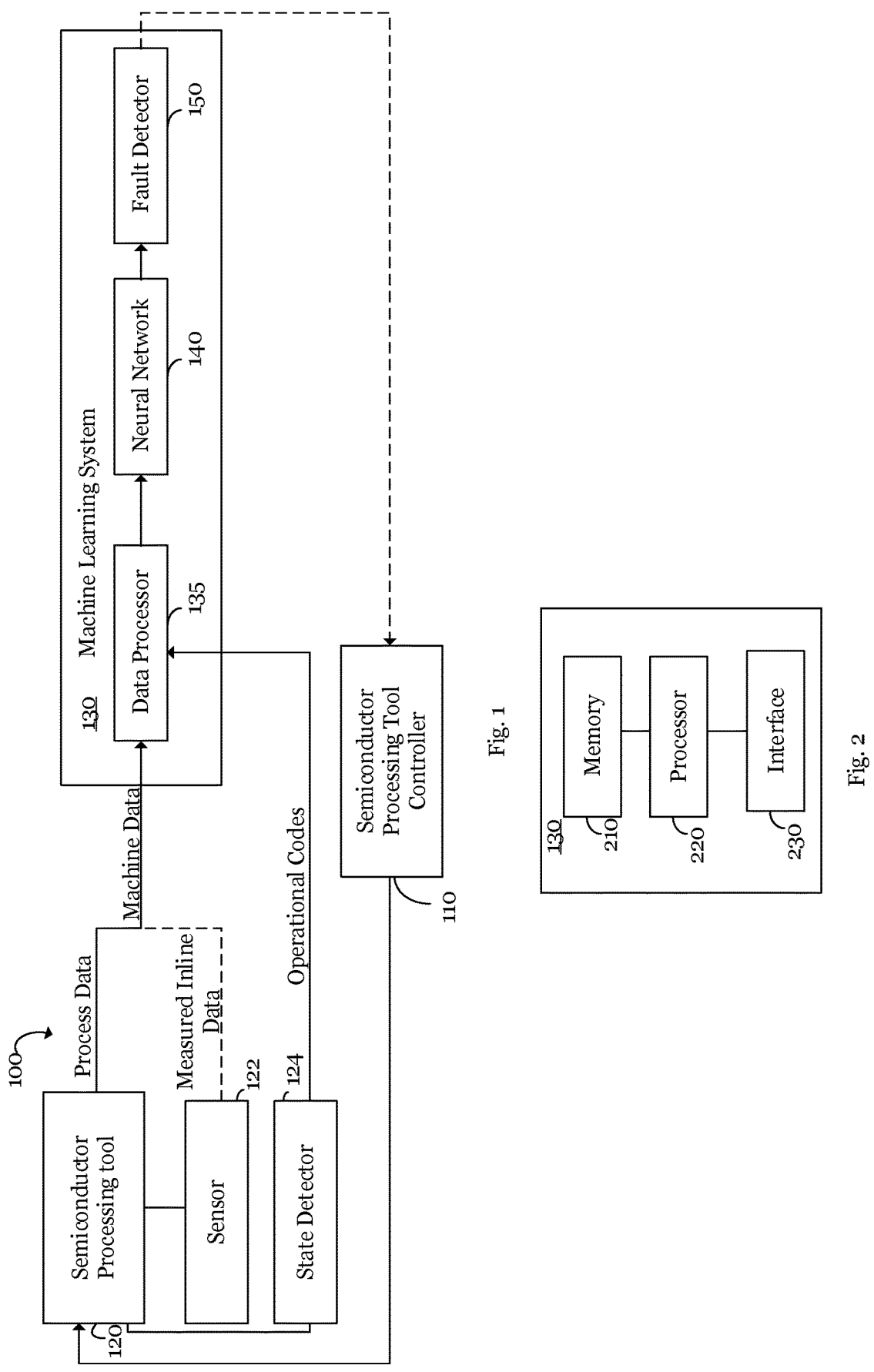
FIG. 1 illustrates a block diagram illustrating a microfabrication fault prediction system in accordance with an embodiment of the present application.
FIG. 2 is a block diagram illustrating a machine learning system in accordance with an embodiment of the present application.

FIG. 1 illustrates a block diagram illustrating a microfabrication fault prediction system 100 in accordance with an embodiment of the present application. As illustrated in FIG. 1, the semiconductor prediction system 100 may include a semiconductor processing tool 120 that is coupled to an AI based tool such as a machine learning (ML) system 130 which may be further coupled to a semiconductor processing tool controller no.

The semiconductor processing tool 120 may comprise any tool used by microfabrication processes such as annealing tools, deposition tools, coating/developing tools, etching tools, surface preparation tools, lithography tools, ion implantation tools including gas cluster ion beam tools, wafer track systems, various chambers, robotic wafer handlers, testing equipment particularly in-situ testing tools, or any other semiconductor processing tool known in the art. Further, a semiconductor processing fault as used herein is defined as a state in which normal operation of a semiconductor processing tool is temporarily halted and/or results in incorrectly processed wafer(s).

In various embodiments, the semiconductor processing tool controller no may comprise a microcontroller, a computer, a microprocessor, or other processing circuitry.

In various embodiments, the machine learning (ML) system 130 may comprise any machine learning system including deep learning algorithms. As one example, the machine learning system may include neural network based deep learning algorithms.

In various embodiments, the ML system 130 may comprise at least one neural network implemented in software that may also include different software modules. In one or more embodiments, the machine learning (ML) system 130 may further comprise software modules such as a data processor 135 and a fault detector 150 that are both coupled to a neural network 140. In various embodiments, the data processor 135, the neural network 140, and the fault detector 150 may be implemented as described further in FIG. 2.

In various embodiments, the semiconductor processing tool 120 may be further coupled to a sensor 122 and a state detector 124. Both the sensor 122 and state detector 124 may be included in or coupled to the semiconductor processing tool 120.

In one or more embodiments, the sensor 122 may include a plurality of sensors configured to measure and output in-situ tool data to the data processor 135. Examples of sensors 122 may include as temperature sensors, pressure sensors, flow meters spectrometry tools, current/voltage sensors, and the like. This will be described in more detail below.

In one or more embodiments, the state detector 122 may be equipment configured to determine the state of the semiconductor tool 120 and output corresponding operational codes to the data processor 135. This will also be described in more detail below.

Prior to being coupled to the semiconductor processing controller no and being used to predict a tool fault, the neural network 140 may be trained. In one or more embodiments, during training, the neural network 140 self-learns how to predict a tool fault while the semiconductor processing tool 120 is processing wafers.

As illustrated in FIG. 1, machine data and operational codes may be collected and accumulated by the data processor 135. In various embodiments, machine data may comprise process data generated by the semiconductor processing tool 120. Process data may refer to the value of process parameters that may be controlled by the semiconductor processing tool user from the time wafer processing begins to a present time. Examples of process data include all process recipes but are not limited to, temperature, pressure, flux of various gases entering the process tool, and the like.

In some embodiments, machine data may further include measured in-situ tool data outputted by the sensor 122. Measured in-situ tool data may refer to data measured by the sensor 122 that occur as a result of the process data. In one or more embodiments, the measured in-situ tool data may refer to any measured process parameters from the time wafer processing begins at the semiconductor processing tool 120 to a present time. Therefore, measured in-situ tool data may include the measured as well as monitored value of process data and/or wafer measurement data such as the temperature of the wafer, the position of the wafer, stator voltage, current/voltage at different nodes within the circuitry of the processing tool 120, and other properties that are being monitored either continuously or periodically.

In some embodiments, machine data may further include ex-situ data obtained from sensors outside of the tool. For example, ex-situ data may include measurements from bulk delivery systems, vacuum systems, abatement systems, and/or processing time-window conditions for substrates being transferred between tools as part of the manufacturing process. The operational codes may be generated by the state detector 124. The operational codes may indicate whether the semiconductor processing tool 120 reaches a fault state with respect to time or condition and/or may comprise codes and/or messages that indicate the state of the semiconductor processing tool 120. For example the operational codes may comprise an error code/message when the semiconductor processing tool reaches a fault state or a code/message indicating the tool is in normal operation or the tool exceeded a threshold value indicative of a state or condition of the tool. In one or more embodiments, the process data, measured in-situ data, measured ex-situ data, and operational codes may be generated on the same time scale.

The manner in which the data processor 135 collects and accumulates data depends on whether the neural network 140 is in the learning phase or use phase. During the learning phase, the neural network 140 is being trained while in the use phase the neural network 140 predicts a state of the semiconductor processing tool 120, e.g., of an imminent fault.

In various embodiments, the neural network 140 may be trained for predicting a state of the semiconductor processing tool 120 using supervised learning prior to the fault actually occurring. During supervised learning, the neural network 140 infers or builds a function from training data that includes a data set of training examples. Each example typically includes an input object and a desired output value. A supervised learning algorithm analyzes the training data and produces an inferred function, which can be used for mapping new examples. An optimal scenario will allow for the algorithm to correctly determine the class labels for unseen instances. This requires the learning algorithm to generalize from the training data to new situations. The learning phase includes determining the type of training example, gathering data for the training example, determining the structure for the learned function, determining how to represent the input for the learned function, running the training algorithm to develop a initial learned function, and evaluating the accuracy of the learned function and retraining or optimizing the learned function to improve accuracy of predictions. Each of these steps will be described in more detail below.

In supervised learning, the neural network 140 may learn how to predict an output by receiving inputs that are mapped to (or labeled with) the expected output. Then, based on the difference between the output predicted by the neural network 140 and the mapped input, the neural network 140 may self-update. Therefore, in one or more embodiments, during training, the data processor 135 may be configured to continuously acquire and accumulate machine data and map the machine data with a future operational code (i.e. the expected output). In other words, during training, as the semiconductor processing tool is operating, the data processor 135 continuously acquires and accumulates machine data and operational codes. Then as the data processor 135 acquires and accumulates machine data and operational codes, it may format machine data with each formatted machine data comprising machine data collected over a respective plurality of time periods, determine the operational codes that exist in the time period following each formatted machine data, map each of the determined operational codes to each respective formatted machine data, and use the mapped machine data as training inputs. This process will be described in more detail below.

Advantageously, the machine learning (ML) system 130 generates mapped machine data that is "self-labeled" for training the neural network 140. One advantage of this is that typically, labeling training data is done by hand which may be time consuming and costly, or by using a database that has a finite amount of data. Self-labeled training data allows for the neural network 140 to be continuously trained while the semiconductor processing tool 120 is processing wafers.

Advantageously, by self labeling data, embodiments of the present invention overcome the need for a large data set traditionally needed for training a neural network. For example, in various embodiments, during regular operation of the processing tool 120, training data (e.g., machine data and operational codes) are continuously collected, which over a period of time, may become large enough to provide a meaningful starting point for training the neural network.

Referring back to FIG. 1, in one or more embodiments, after sufficient training, a first neural network 140 configured to predict a faulted state of the semiconductor processing tool 120 is generated. Therefore, the ML system 130 may be further coupled to the semiconductor processing controller no. The semiconductor processing controller no may be coupled to or included in the semiconductor processing tool 120.

In various embodiments, in the use phase, the neural network 140 may be continuously fed a plurality of unmapped machine data formatted by the data processor 135. Each unmapped machine data, i.e., machine data output by a processing tool after sufficient training, may correspond to a time period, with each time period being the same length as the time periods used in training. The neural network 140, based on its training, generates an output that is fed to the fault detector 150. The fault detector 150, based on the output of the neural network 140 determines whether a fault will occur in a time period immediately adjacent to each machine data. The output of the fault detector 150 may then be fed to the semiconductor processing tool controller no and inform the user of the future state of the tool. If the output of the fault detector 150 is indicative of an upcoming fault, the semiconductor processing tool controller no may generate a control signal to cease the running of wafers prior to the fault and inform the responsible person or take a set of preprogrammed actions to avert the upcoming fault. Advantageously this prevents wafer scrap before it happens and corrective action, such as adjusting the processing parameters, may be taken before the occurrence of the fault.

In various embodiments, the semiconductor processing tool controller no and the machine learning (ML) system 130 may be integrated into a single system, and in some embodiments, they may be integrated with the semiconductor processing tool 120 into a single system.

FIG. 2 illustrates a block diagram of an example ML system 130 for performing methods described herein in accordance with an embodiment of the present application.

As shown, the machine learning (ML) system 130 includes a memory 210, a processor 220, and an interface 230 which may (or may not) be arranged as shown in FIG. 2.

The processor 220 may be any component or collection of components adapted to perform the operations and computations of the ML system 130. In one or more embodiments, in order to increase the throughput of the ML system, the processor 220 may be implemented as a plurality of large scale graphical processing units (GPUs). For example, each individual computation of the neural network may be performed independently by the plurality of GPUs in parallel, saving overall processing time. In other embodiments the processor 220 may be implemented as an AI supercomputer including GPU multiclusters.

In various embodiments, the processor 220 may also be implemented as plurality of flexible programmable logic arrays (FPGAs) or application specific integrated circuits (ASICs) in order to increase the processing speed of the ML learning system 130.

In various embodiments, the processor 220 may be implemented as a central AI supercomputer comprising GPU multiclusters that may be connected to multiple semiconductor processing tools. In other words, the processor 220 may be a central processor implemented to support multiple ML systems 130. For example, machine data collected by multiple ML systems 130 implemented on different semiconductor processing tools can send machine data to the central GPU multicluster supercomputer.

The memory 210 may be any component or collection of components adapted to store the neural network, programming, and/or instructions for execution by the processor 220. In one or more embodiments, the memory 210 includes a non-transitory computer readable medium. In various embodiments, a computer-readable medium memory may include an non-transitory mechanism for storing information that can be read by a machine including read only memory (ROM), random access memory (RAM), magnetic disk storage media, optical storage media, flash-memory devices, solid state storage media, and the like.

In various embodiments, the data processor 135, the neural network 140, and the fault detector 150 may be implemented in a program stored in the memory 210, which is then executed in the processor 220.

Advantageously, in one or more embodiments, after the neural network 140 is trained for the semiconductor processing tool 120, the neural network 140 may be stored to the memory 210 of the ML system 130. One advantage of this is that it allows for the trained neural network to be implemented on a further ML system that may be coupled to a further processing tool. In one or more embodiments, the further ML system may be coupled to a further processing tool that is the type of tool as the semiconductor processing tool 120 without additional training. In one or more embodiments, the trained neural network may be implemented on a further semiconductor processing tool that is located in the same fabrication facility or a different fabrication facility.

In other embodiments, the further semiconductor processing tool may be a different type of processing tool that shares some features with the semiconductor processing tool 120. When the further semiconductor processing tool is one of a different type, the neural network may be further trained during operation of the further processing tool. This may result in a further neural network trained for the further semiconductor processing tool.

The interface 230 may be any component or collection of components that allow the ML algorithm 130 to communicate with other devices/components such as the semiconductor processing tool controller 120. For example in one or more embodiments, the interface 230 may be adapted to allow the ML system 130 to communicate with the semiconductor processing tool controller no to inform the semiconductor processing tool controller no to cease the running of wafers prior to the semiconductor processing tool 120 failing. In other embodiments, the interface 230 may be further adapted to communicate with a display to inform the user of predicted state of the tool. The ML system 130 may include additional components not depicted in FIG. 2 such as long term storage (e.g., non-volatile memory, etc.).

Figure 3:
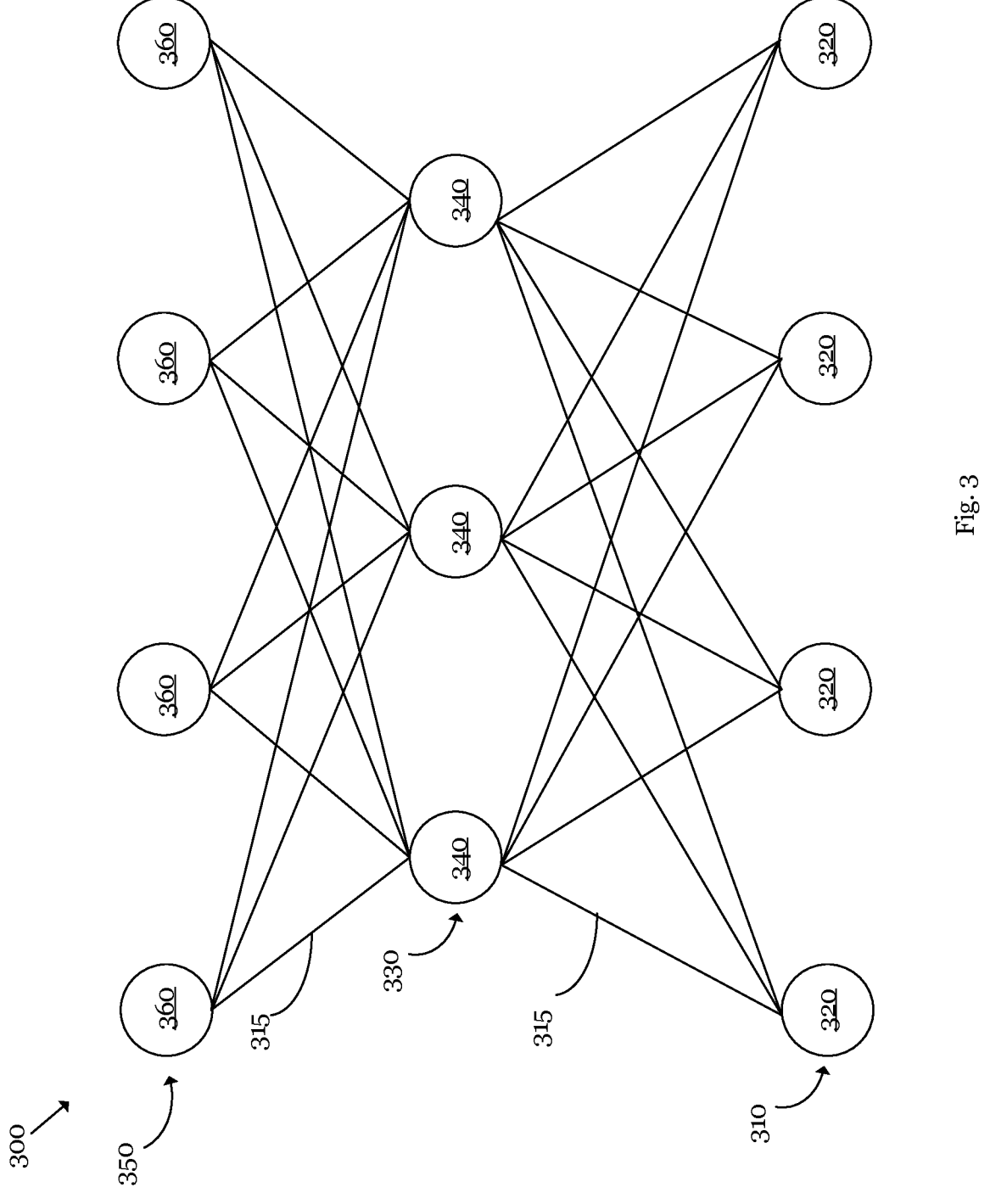
FIG. 3 is a diagram illustrating an example neural network implemented in the machine learning system in accordance with an embodiment of the present application.

FIG. 3 is a diagram illustrating an example neural network implemented in the machine learning system in accordance with an embodiment of the present application.

FIG. 3 illustrates a simplified diagram of a feed forward multi-layered neural network 300 that may be implemented onto the machine learning (ML) system 130. The neural network 300 comprises an input layer 310 comprising input nodes 320, at least one hidden layer 330 comprising hidden nodes 340 and an output layer 350 comprising output nodes 360. There is no limitation on the number of input nodes 320, hidden layers 330, hidden nodes 340, and output nodes 360. Therefore, any suitable number of input nodes 310, output nodes 350, and hidden layers 330 may be used. Although FIG. 3 illustrates a single neural network, the ML system 130 may comprise multiple neural networks.

The neural network 300 operates as a feed-forward neural networking, meaning that data always moves in a single-direction (e.g. forward) through the neural network 300. In other words, the neural network 300 operates by receiving inputs at the input nodes (i.e. machine data) and outputting predictions (i.e. the future state of the processing tool) in terms of probabilities of an outcome at the output nodes. In one or more embodiments, the neural network 300 may comprise an output node for every possible operational code of a semiconductor processing tool 120. In other embodiments, there may be two output nodes, one node outputting the probability that a fault will occur and another output node for outputting the probability a fault will not occur. The number of input and output nodes is not limited by this disclosure.

Although a feed-forward neural network is described herein, the neural network 300 may be any type of suitable neural network. For example, the neural network 300 may comprise other types of neural networks such as a recurrent neural network (RNN) or a convolutional neural network (CNN). The type of neural network used is not limited by this disclosure.

As illustrated in FIG. 3, the input nodes 320 and each successive layer are connected using weighted connections 315. Each weighted connection 315 includes a unique weight that determines how relative the effect of an input is on the output. The weight values corresponding to each weighted connection 315 is the knowledge structure of the neural network 300. Here, learning and/or training is defined as any self-directed change of the knowledge structure of the neural network 300 that improves performance.

The hidden nodes 340 each implement a non-linear mathematical activation function that applies the set of weights to the input to generate a learned function. In one or more embodiments, each of the hidden nodes 340 may apply the same non-linear activation function. In other embodiments, hidden nodes 340 may apply different non-linear activation functions. For example non-linear activation functions may be a sigmoid function, a ReLU function or any other known non-linear activation functions known in the art.

As explained above, the neural network 300 may be trained using labeled training data (i.e. machine data mapped to a subsequent operational code). This is known as supervised learning. A supervised learning algorithm requires, prior to labeling the training data, determining the format of the training data. In various embodiments, the format of the training data may be based of the structure of the learned function. In other words, the training data must be compatible with the learned function. Examples of learned functions may include but are not limited to, support vector based learned functions and decision tree based learned functions.

For example, in various embodiments, if the learned function is a support vector based learned function, the machine data (e.g. training data) may be formatted as an n-dimensional vector of numerical features to represent the machine data known as a feature vector. In one or more embodiments, the machine data may be formatted as a feature vector comprising the raw values of the machine data or as an image with the feature vector values comprising the pixel values of the image.

Then, in various embodiments, after determining the format of the training data and the learned function, random weights may be assigned to each weighted connection 315 and the learned function may be initialized. In one or more embodiments, after initializing the learned function, during operation of the semiconductor processing tool 120, the mapped ("self-labeled") machine data formatted by the data processor 135 may be fed into the neural network and used to update the learned function. In other words, based on the relationship between the training data and its respective mapping, the neural network learns, self-updates the learned function, and generates a model to predict outcomes based on inputs without mapping after sufficient training.

Semiconductor processing tools continuously generate large quantities of complex data. This may result in unrecognizable relationships between tool processing performance variables. Even the most subtle change in a machine data value can result in a processing failure. Therefore, in one or more embodiments, a group of learning/training techniques that utilize pattern association, such as back propagation may be used to train the neural network 300. The goal of pattern association learning is to map an output pattern to an input pattern. Pattern association learning techniques provide a set of rules and instructions to the neural network 300 to self-adjust the learned function in response to the output generated from a mapped input. In other words, the neural network 300 has the ability to autonomously update itself as it receives mapped inputs to improve its performance.

Advantageously, pattern association learning allows for the neural network 300 to detect a pattern between the relationships of machine data values. One advantage of this is that it allows the neural network 300 to learn and recognize patterns between values of machine data input that may not be noticeable by an expert.

Figure 4A:
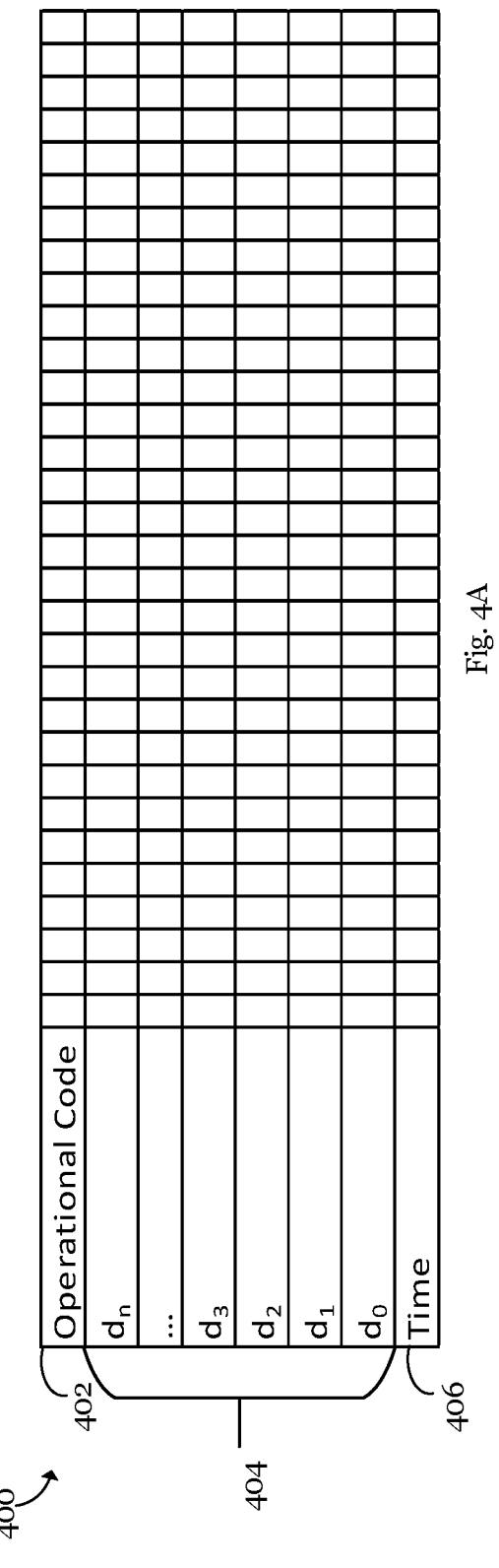
FIGS. 4A-4E illustrate intermediate steps of acquiring, accumulating, and formatting machine data for input into a neural network in accordance with an embodiment of the present application, where
Figure 4B:
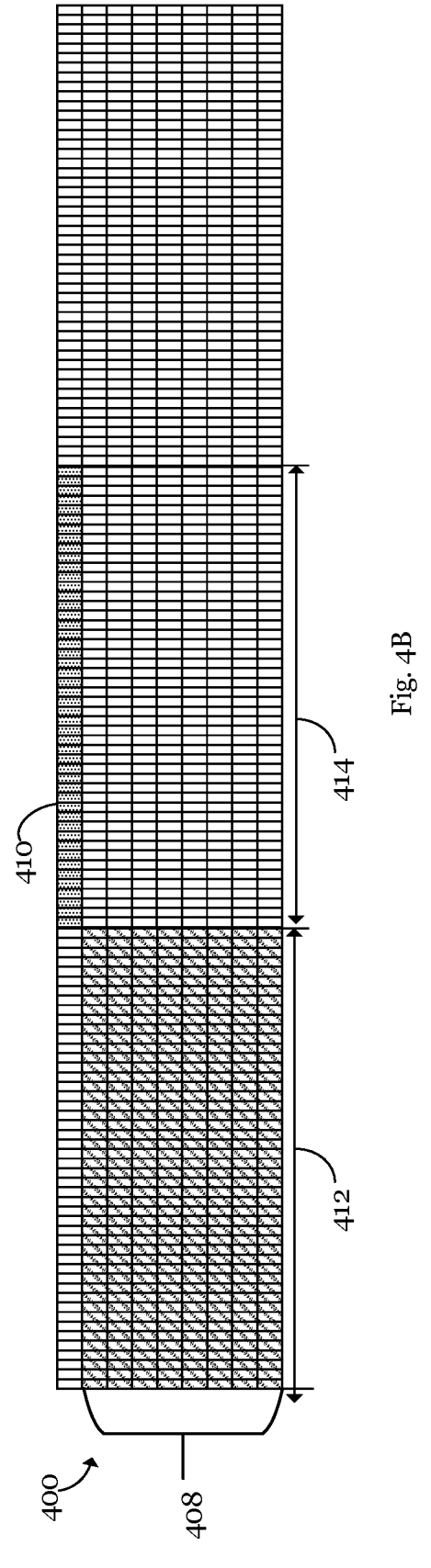
Figures 4C, 4D:
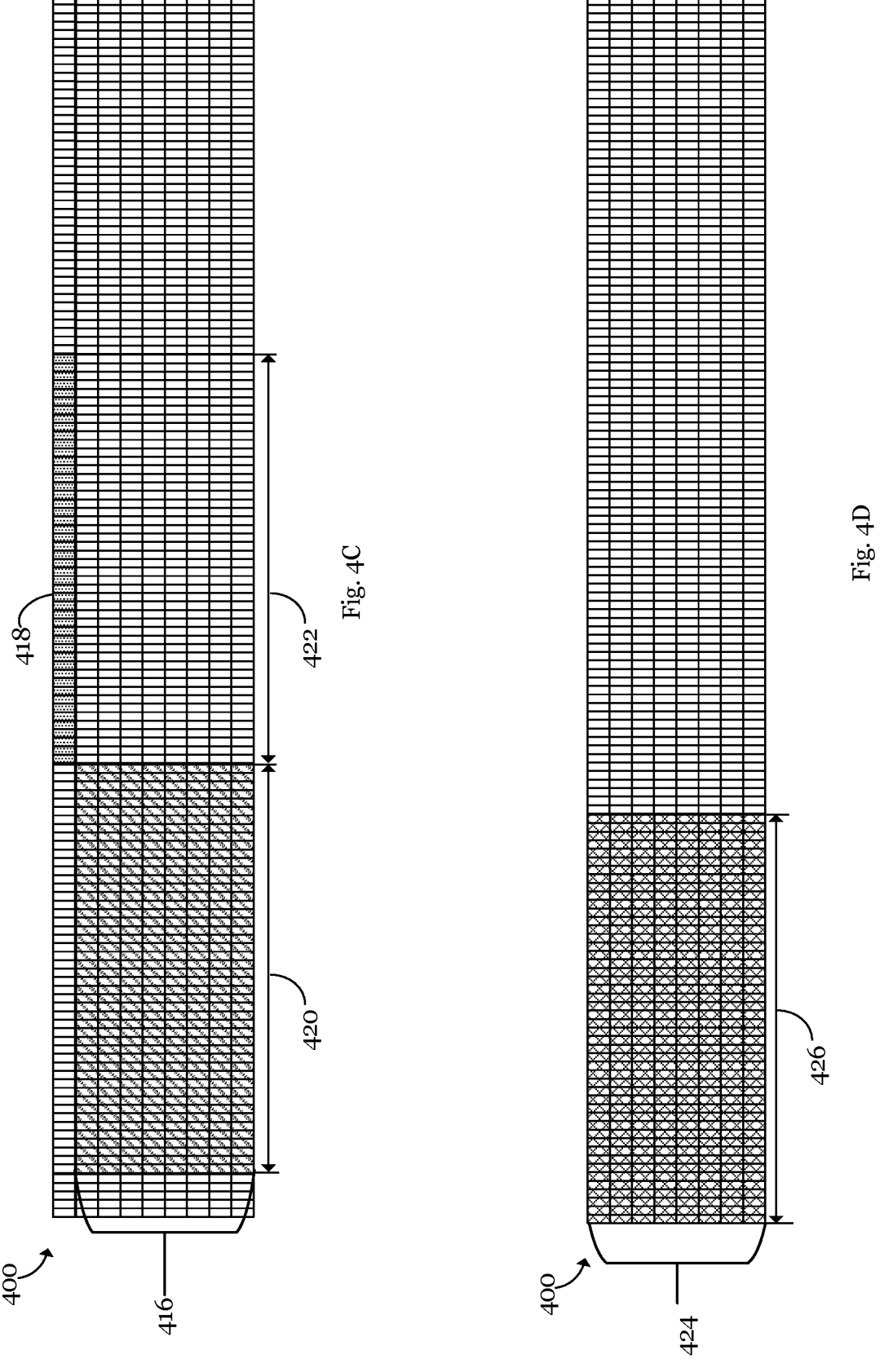
Figure 4E:
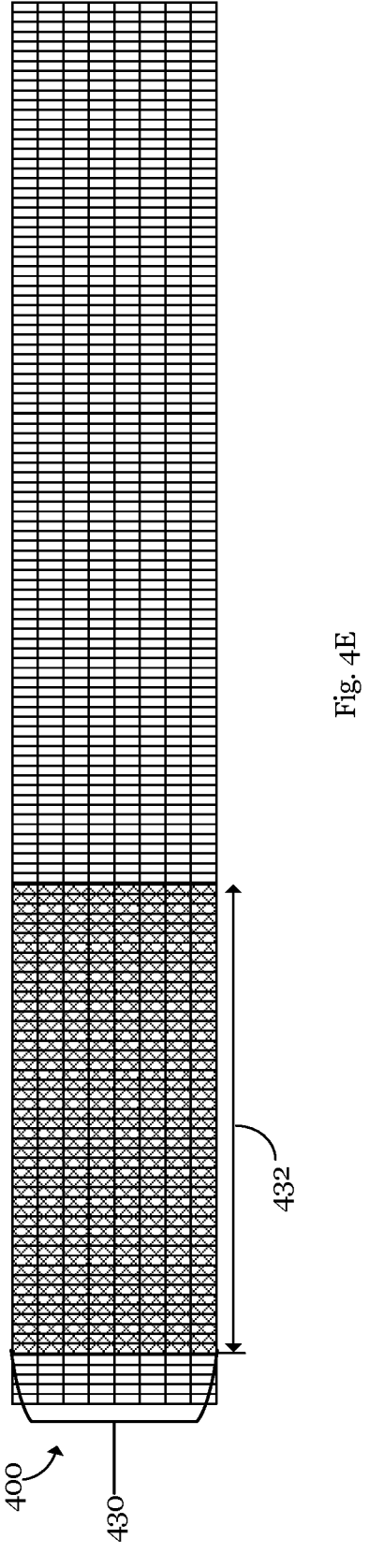

FIGS. 4A-4E illustrate intermediate steps of acquiring, accumulating, and formatting machine data for input into a neural network in accordance with an embodiment of the present application, where FIG. 4A illustrates collected and accumulated machine data, and operational codes, FIG. 4B illustrates a first formatted machine data for use in the training phase, FIG. 4C illustrates a second formatted machine data for use in the training phase, FIG. 4D illustrates a first further formatted machine data for use in the use phase, and FIG. 4E illustrates a second further formatted machine data for use in the use phase. FIG. 5 is a flow chart illustrating an example process flow used to train and use a neural network to predict a semiconductor processing tool fault in accordance with an embodiment of the present application.

FIG. 4A illustrates an example of the output of a semiconductor processing tool 400, which may be similar to the semiconductor processing tool 120 discussed above. As illustrated in FIG. 4A, in one or more embodiments the output of a semiconductor processing tool 400 may comprise machine data 404 and operational codes 402. As explained above, machine data 404 may comprise processing data generated by the processing tool 120 and/or measured in-situ tool data measured by the sensor 122. The machine data 404 may be defined as a plurality of machine data values represented as $d_0$ through $d_n$. The operational codes 402 may comprise the status of the semiconductor processing tool 120 (e.g. whether it is in a fault state) along with a corresponding code/message indicating the state of the tool. For example the corresponding code/message may indicate substrate position, pressure, robot speed, stator voltage, temperature, or the like. As illustrated in FIG. 4A the output of a semiconductor processing tool 400 is constantly outputted at intervals of time 406. For example the output of a semiconductor processing tool 400 may be outputted continuously or after periodic intervals.

In various embodiments, as also described with respect to FIGS. 4A-4B, machine data may be generated over a plurality of time periods during operation of the first semiconductor processing tool 120 (block 502), where each of plurality of machine data includes process data of the processing tool during the operation over a respective one of a plurality of time periods.

Next, operational codes in each time period immediately following each machine data may be determined (block 504). Specifically, a plurality of operational codes are determined where each of the plurality of operational codes follows an associated time period of the plurality of time periods for each of the plurality of machine data. Each of the plurality of operational codes is separated in time from an adjacent one of the plurality of operational codes by at least one time period. See, e.g., description of first time period 412 and second time period 414 and its relationship to operational codes 410 further described below using FIG. 4B.

FIG. 4B illustrates an example of a first machine data 408 formatted for input into the neural network 140 when the machine learning (ML) system 130 is in the training phase. As illustrated in FIG. 4B, the data processor 135 collects and accumulates the output of a semiconductor processing tool 400 during operation. In one or more embodiments, as the output of a semiconductor processing tool 400 is collected and accumulated, the data may be portioned into time periods. In the illustrated example in FIG. 4B, the output of a semiconductor processing tool 400 may be portioned into a first time period 412 and a second time period 414. In various embodiments, the second time period 414 may begin immediately after the conclusion of the first time period 412. The length of the first time period 412 and the second time period 414 may have a length in minutes (e.g. 10 minutes) to days (e.g. 2 days). The duration of the first time period 412 and the second time period 414 may be the same duration or may have different durations.

In various embodiments, as described above, the manner in which machine data is formatted is based on the structure of the learned function. In one or more embodiments, as previously explained, if the learned function is a support vector based learned function, the machine data may be formatted as a feature vector. For example, in one or more embodiments, the machine data may be converted into images. Then the images may be formatted as feature vectors.

Referring back to the illustrative example in FIG. 4B, in one or more embodiments, the machine data collected over the first time period 412 may be converted into a first machine data image. The size of first machine data image may be defined by its length (l) multiplied its width (w) in pixels. The length (l), in pixels, of the machine data image may be equal to the number of time intervals included in the first time period. The width (w) in pixels of the first machine data image may be equal to the number (n), of machine data values ($d_n$). Then, the first data machine image may be formatted as a feature vector of size 1 by w that is populated by values corresponding to the pixel value of each machine data variable within the first time period 412.

In other embodiments, the first machine data 408 may be formatted as a feature vector populated with the raw machine data values.

After formatting the first machine data 408, the operational code(s) 410 present in the second time period 414 may be determined (block 504). Using the first machine data 408 as the input and the respective operational code 410 as the output, the operational code 410 can be mapped to the first machine data 408. This results in a first "self-labeled" machine data that is input into the neural network 140 for training (block 506).

Then, after inputting the first machine data 408 mapped to the first operational code 410 into the neural network 14*o*, the first time period 412 and the second time period 414 may be time-shifted an equal amount of time. Additional machine data may be mapped to respective operational codes corresponding to the time-shifted time periods and be used to train the neural network 140 using the process described above.

FIG. 4C illustrates an example of a second machine data 416 formatted for input into the neural network 140 when the machine learning (ML) system 130 is in the training phase.

Next, as described in more detail with respect to FIG. 4C, the neural network may be trained using machine data as inputs mapped with respective operational codes as outputs (block 506) to generate a neural network trained for the processing tool, where each of the plurality of inputs is mapped with the plurality of outputs based on the plurality of time periods.

Referring to FIG. 4C, a second machine data 416 is formatted by the data processor 135 and mapped (e.g. labeled) to a respective operational code 418. The second machine data 416 may be formatted by time-shifting the first time period 412 and the second time period 414 by equal amounts of time. After time-shifting the first time period 412 and the second time period 414, the second machine data 416 is formatted by populating a second feature vector with the machine data included in the time-shifted first time period 420 using the same process described in FIG. 4B.

After generating the second machine data 416, the data processor 135 may determine an operational code 418 present in the time-shifted second time period 422. Then, using the second machine data 416 as the input and the respective operational code 418 as the output, the operational code 418 can be mapped to the second machine data 416 and fed to the neural network 140. This process may be repeated using a predetermined number of machine data until the neural network 140 is sufficiently trained. This may form a first trained neural network for the semiconductor processing tool 120.

In various embodiments, after generating the first neural network with a predetermined number of machine data mapped to corresponding operational codes, the performance of the first neural network may be tested to see if it is sufficiently trained. In one or more embodiments, the first neural network may be tested by inputting a series of machine data that is unmapped into the first neural network, and comparing the output of the fault detector 150 with known operational codes. As explained above, the first neural network may output a set of probabilities corresponding to each operational code. Then based on the probabilities outputted by the first neural network, the fault detector 150 may predict the future operational codes of the semiconductor processing tool 120. Therefore, the output with the highest probability is considered the prediction of the first neural network. In one or more embodiments, the first neural network is sufficiently trained for the semiconductor processing tool 120 when the output of the neural network for each unmapped machine data used during testing predicts the proper output with a minimum threshold probability. The minimum threshold probability may be set by the user and may be within a range between 90% and 98% for example.

If the outputs during testing do not meet a required threshold probability, the first neural network may be further trained using the process described in FIGS. 4A-4C for another predetermined number of mapped machine data. For example, during the retraining, the neural network 140 and/or the time durations such as the first time duration 412 and the second time duration 414 may be modified. In some embodiments, multiple neural networks may be generated in parallel to save time (or sequentially) until a satisfactory trained neural network that has a desired threshold predictability is obtained.

In various embodiments, the first neural network trained for the semiconductor processing tool 120 may be saved to the memory 210 of the ML system 130. The ML system 130 may then be implemented on a further semiconductor processing tool. In one or more embodiments if the further semiconductor processing tool is the same type of tool as the semiconductor processing tool 120, no significant additional training may be required. In other embodiments, if the further semiconductor processing tool is a different type of processing tool the neural network may be further trained using the process described in FIGS. 4A-4C. This may result in a further neural network trained for the further semiconductor processing tool.

Referring to FIG. 4D, after generating the first neural network for the semiconductor processing tool 120, the first neural network may be coupled to the semiconductor processing tool controller no and may be used to generate an output indicative of a fault of the tool (block 508). As explained above during operation, the data processor 135 may continuously collect and accumulate further machine data and format the further machine data. In various embodiments the further machine data may be unmapped and correspond to machine data collected over a plurality of further time periods. In various embodiments, the further time periods may have a same duration as the first time period.

Referring back to FIG. 4D, a first further machine data 424 comprising machine data accumulated over a first further time period 426 may be fed into the first neural network. The first neural network based on its training, may output the probabilities of the future state of the tool to the fault detector iso. The fault detector 150, based on the output of the first neural network, may inform the semiconductor processing tool controller no and the user whether the semiconductor processing tool 120 is going to reach a fault state. If the fault detector 150 determines the semiconductor processing tool 120 is going to reach a fault state, it sends signals to the semiconductor processing tool controller no and the user, and stops running wafers. Advantageously this allows the user to adjust the processing parameters causing the fault and prevents wafer scrap.

Referring to FIG. 4E, the first further time period 426 may be shifted, and a second further machine data 430 corresponding to machine data accumulated over a time-shifted first further time period 432 may be formatted and used to predict a semiconductor processing tool fault. This process may be repeated until processing is complete.

In various embodiments, the machine learning (ML) system 130 may comprise multiple neural networks trained in parallel. When multiple neural networks are used, each neural network is trained with mapped machine data generated over different sized time periods. For example if two neural networks are used, one neural network may be trained with machine data generated over a time period less than the other neural network. Advantageously this allows for multiple neural networks to be trained in order to determine the optimal machine data dimensions for the semiconductor processing tool 120.

FIG. 6 is a flow chart illustrating an example process flow used to implement a trained neural network onto an additional semiconductor processing tool to used to predict a fault state of the additional semiconductor processing tool in accordance with an embodiment of the present application.

As illustrated in block 602 and described with reference to FIG. 1, a neural network 140 is initialized on a processor of a ML system 130 coupled to a semiconductor processing tool 120.

As next illustrated in block 604 and described with reference to FIG. 1, after initializing the neural network 140, the neural network 140 may be trained to predict whether the first semiconductor processing 120 tool will reach a fault state. The neural network 140 may be trained in the same manner described in FIGS. 4A-4C.

As next illustrated in block 606, and described with reference to FIGS. 1 and 2, after the neural network 140 has been sufficiently trained, the neural network 140 may be saved to the memory 210 of the ML system 130.

As next illustrated in block 608, after the neural network is saved to the memory 210 of the ML system 130, the ML system 130 may be implemented onto a further semiconductor processing tool. In various embodiments, the further semiconductor processing tool may be the same type of tool as the semiconductor processing tool 120. In one or more embodiments both the first and second semiconductor processing tools may be located in the same fabrication facility (fab). In other embodiments, the first and second semiconductor processing tools may be located in different fabs having different geographic locations. Advantageously, because the semiconductor processing tools are the same type, the neural network 140 may not have to be trained again. Advantageously, although a trained neural network may be implemented in a second location different from the first location at which the neural network was trained, no machine data including process parameters/recipes need to be transported to the second location. This avoids issues relating to data export and confidentiality.

In various embodiments, a single artificial (AI) algorithm may be used to predict operation faults across multiple semiconductor processing tools of a semiconductor processing factory line.

Figure 7:
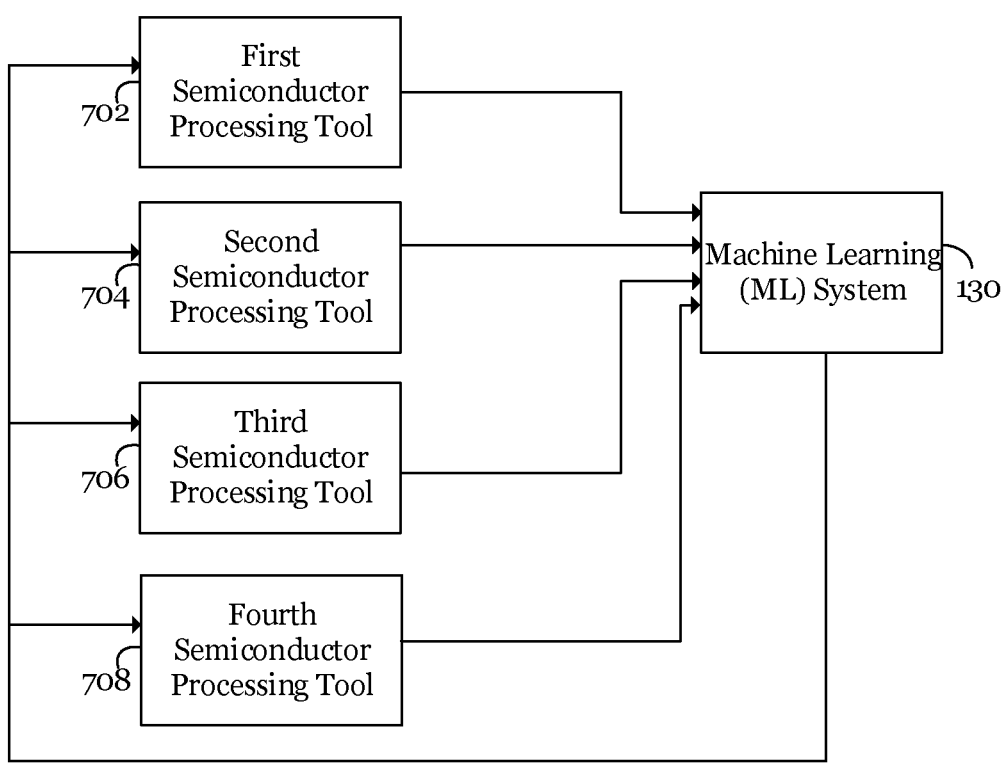
FIG. 7 illustrates a block diagram illustrating a fault prediction system in accordance with an embodiment of the present application.

FIG. 7 illustrates a block diagram illustrating a fault prediction system in accordance with an embodiment of the present application.

Various embodiments may be applied to include a plurality of processing tools with a common machine learning system.

Referring to FIG. 7, a first semiconductor processing tool 702, a second semiconductor processing tool 704, a third semiconductor processing tool 706, and a fourth semiconductor processing tool 708 may be coupled to a machine learning (ML) system 130. The first semiconductor processing tool 702, second semiconductor processing tool 704, third semiconductor processing tool 706, and fourth semiconductor processing tool 708 are analogous to the semiconductor processing tool 120 described in FIG. 1 and their descriptions are incorporated by reference and are not repeated.

Although FIG. 7 illustrates four semiconductor processing tools, this is not indicative of the number of semiconductor processing tools that may be coupled to the ML system 130.

In one or more embodiments, the ML system 130 may gather machine data and operational codes from each of the semiconductor processing tools, self-learn how to predict faults across the factory line, and may be used to predict operational faults across the factory line.

Advantageously, using a single ML system 130 may allow for the ML system 130 to learn and evaluate interrelationships between multiple semiconductor tools. For example, a robotic handler that may move wafers between multiple chambers and/or multiple chamber equipment may all be coupled to the ML system 130. For example, the ML system may be able to detect a fault caused by an annealing chamber after a wafer exits a deposition chamber, or a fault caused by the robotic handler while transferring a wafer but determined after a subsequent process such as after the wafer passes the annealing chamber, or a fault caused by an aligning tool that is noticed only after the wafer is developed after a lithography process. One advantage of this is that interrelationships between process parameters of multiple semiconductor processing tools, individually and as a whole, may be evaluated by a single ML system 130 which may halt processing of wafers when it predicts a upcoming failure and prevent wafer scrap.

In various embodiments, a semiconductor processing factory line may be compartmentalized and coupled to multiple AI algorithms used to predict semiconductor processing tool faults.

Figure 8:
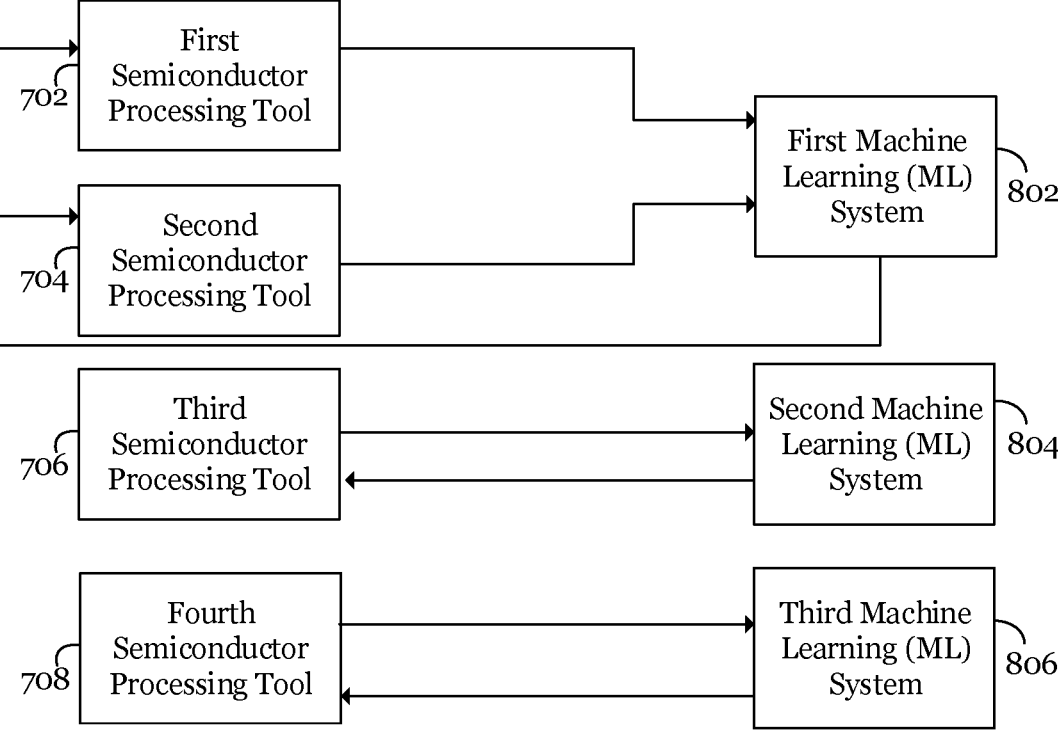
FIG. 8 illustrates a block diagram illustrating a microfabrication fault prediction system in accordance with an embodiment of the present application.

FIG. 8 illustrates a block diagram illustrating a semiconductor processing fault prediction system in accordance with an embodiment of the present application.

Referring to FIG. 8, a first semiconductor processing tool 702 and a second semiconductor processing tool 704 may be coupled to a first machine learning (ML) system 802, a third semiconductor processing tool 706 may be coupled to a second ML system 804, and a fourth semiconductor processing tool 708 may be coupled to a third ML system 806. The first ML system 802, the second ML system 804, and the third ML system are analogous to the ML system 130 described in FIG. 1 and their descriptions are incorporated by reference and are not repeated.

This may be indicative of a production line in which a wafer passes sequentially through the semiconductor processing tool 702, the second semiconductor processing tool 704, the third semiconductor processing tool 706, and the fourth semiconductor processing tool 708. Thus processing tools are grouped into separate modules, where each module has its own machine learning system. A plurality of machine learning systems may thus be set up and designed to prevent an upcoming failure in each module.

Although the illustrated example shows four semiconductor processing tools, the number of processing semiconductor processing tools and the number of tools coupled to an ML system are not limited by this disclosure.

In other embodiments, as discussed above, the ML system 130 may be implemented on a further semiconductor processing tool that may be a different type of tool than the semiconductor processing tool 120. In this case, the neural network 140 may be further trained to operate on the further semiconductor processing tool.

Example embodiments of the invention are summarized here. Other embodiments can also be understood from the entirety of the specification as well as the claims filed herein.

Example 1. A method including: collecting first processing tool machine data from a first processing tool while treating semiconductor substrates, the first processing tool machine data including process data mapped to operational codes associated with one or more discrete intervals of time during the treatments; training a first neural network with the first processing tool machine data from the first processing tool; and generating a first output indicative of a fault of the first processing tool from the first neural network, based, at least in part, on applying unmapped machine data from at least one processing tool.

Example 2. The method of example 1, further including: stopping the treating of the semiconductor substrates in the at least one processing tool based on the first output.

Example 3. The method of one of examples 1 or 2, further including: collecting second processing tool machine data from a second processing tool while treating other semiconductor substrates, the second processing tool machine data being arranged in a similar manner as the first processing tool machine data, where the training of the first neural network includes training the first neural network with the second processing tool machine data.

Example 4. The method of one of examples 1 to 3, where the process data is indicative of process conditions during the semiconductor substrate treatments, and where the operational codes is indicative of one or more conditions of the first processing tool during the semiconductor substrate treatments.

Example 5. The method of one of examples 1 to 4, where the process data includes in-situ measurement data during the semiconductor substrate treatments.

Example 6. The method of one of examples 1 to 5, where the operational codes include alarm/warning conditions, tool state information, or tool usage information.

Example 7. The method of one of examples 1 to 6, where collecting first processing tool machine data from a first processing tool is performed at a first location and collecting second processing tool machine data from a second processing tool is performed at a second location different from the first location.

Example 8. The method of one of examples 1 to 7, further including generating a second output indicative of a fault of the second processing tool from the first neural network, based, at least in part, on applying unmapped machine data from at least one processing tool.

Example 9. The method of one of examples 1 to 8, further including: collecting second processing tool machine data while treating other semiconductor substrates, the second processing tool machine data being arranged in a similar manner as the first processing tool machine data; training a second neural network using the second processing tool machine data; and generating a second output indicative of a fault from the second neural network, based, at least in part, on applying subsequent machine data from at least one processing tool.

Example 10. A tool system including: a processor; a non-transitory memory coupled to the processor and including a program to be executed in the processor, the program including instructions for: collecting first processing tool machine data from a first processing tool while treating semiconductor substrates, the first processing tool machine data including process data mapped to operational codes associated with one or more discrete intervals of time during the treatments; training a first neural network with the first processing tool machine data; and generating a first output indicative of a fault from the first neural network, based, at least in part, on applying unmapped machine data from at least one processing tool.

Example 11. The tool system of example 10, where the program further includes instructions for stopping the treating of the semiconductor substrates in the at least one processing tool based on the first output.

Example 12. The tool system of one of examples 10 or 11, further including the first processing tool.

Example 13. The tool system of one of examples 10 to 12, where the program further includes instructions to store the first neural network in the non-transitory memory.

Example 14. The tool system of one of examples 10 to 13, where the program further includes instructions to convert the process data of the first processing tool machine data into a plurality of images for training the first neural network.

Example 15. The tool system of one of examples 10 to 14, where the process data is indicative of process conditions during the semiconductor substrate treatments and the operational codes are indicative of one or more conditions of the first processing tool during the semiconductor substrate treatments.

Example 16. The tool system of one of examples 10 to 15, where the operational codes include alarm/warning conditions, tool state information, or tool usage information.

Example 17. A method including: initializing a neural network on a processor of a first machine learning system coupled to a first semiconductor processing tool for processing wafers; training the neural network to predict a failure of the first semiconductor processing tool; after training the neural network, saving the neural network to a memory of the first machine learning system; and implementing the first machine learning system on a second semiconductor processing tool.

Example 18. The method of example 17, where the first semiconductor processing tool and the second semiconductor processing tool are a same type of tool.

Example 19. The method of one of examples 17 or 18, where the first semiconductor processing tool and the second semiconductor processing tool are different types of tools.

Example 20. The method of one of examples 17 to 19, where implementing the first machine learning system on a second semiconductor processing tool further includes training the neural network to predict a failure of the second semiconductor processing tool.

Example 21. The method of one of examples 17 to 20, where the first semiconductor processing tool and the second semiconductor processing tool are located in different fabrication facilities.

Example 22. The method of one of examples 17 to 21, where the first semiconductor processing tool and the second semiconductor processing tool are located in a same fabrication facility.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method comprising:
collecting first processing tool machine data from a first processing tool while treating semiconductor substrates, the first processing tool machine data comprising process data mapped to operational codes associated with one or more discrete intervals of time during the treating, wherein the operational codes comprise data generated by a state detector coupled to the first processing tool during the treating and being indicative of an operational status of the first processing tool, the operational status comprising information indicating a fault state of the first processing tool and a normal operation of the first processing tool;

training a first neural network with the first processing tool machine data from the first processing tool, the training being performed by including the information indicating the fault state of the first processing tool and the normal operation of the first processing tool; and generating a first output indicative of a fault of the first processing tool from the first neural network, based, at least in part, on applying unmapped machine data from at least one processing tool.

2. The method of claim 1, further comprising:

stopping the treating of the semiconductor substrates in the at least one processing tool based on the first output.

3. The method of claim 1, further comprising:

collecting second processing tool machine data from a second processing tool while treating other semiconductor substrates, the second processing tool machine data being mapped to respective operational codes associated with one or more discrete intervals of time, wherein the training of the first neural network includes training the first neural network with the second processing tool machine data.

4. The method of claim 1, wherein the process data is indicative of process conditions during treating the semiconductor substrates.

5. The method of claim 1, wherein the process data comprises in-situ measurement data during treating the semiconductor substrates.

6. The method of claim 1, wherein the operational codes comprise alarm/warning conditions, tool state information, or tool usage information.

7. The method of claim 3, wherein collecting first processing tool machine data from a first processing tool is performed at a first location and collecting second processing tool machine data from a second processing tool is performed at a second location different from the first location.

8. The method of claim 3, further comprising generating a second output indicative of a fault of the second processing tool from the first neural network, based, at least in part, on applying unmapped machine data from at least one processing tool.

9. The method of claim 1, further comprising:

collecting second processing tool machine data from a second processing tool while treating other semiconductor substrates, the second processing tool machine data being mapped to respective operational codes associated with one or more discrete intervals of time;

training a second neural network using the second processing tool machine data; and generating a second output indicative of a fault of the second processing tool from the second neural network, based, at least in part, on applying subsequent machine data from at least one processing tool.

10. A tool system comprising:

a processor; and a non-transitory memory coupled to the processor and comprising a program to be executed in the processor, the program comprising instructions for:

collecting first processing tool machine data from a first processing tool while treating semiconductor substrates, the first processing tool machine data comprising process data mapped to operational codes associated with one or more discrete intervals of time during the treating, wherein the operational codes comprise data generated by a state detector coupled to the first processing tool during the treating and being indicative of an operational status of the first processing tool, the operational status comprising information indicating a fault state of the first processing tool and a normal operation of the first processing tool;

training a first neural network with the first processing tool machine data, the training being performed by including the information indicating the fault state of the first processing tool and the normal operation of the first processing tool during the treating; and generating a first output indicative of a fault of the first processing tool from the first neural network, based, at least in part, on applying unmapped machine data from at least one processing tool.

11. The tool system of claim 10, wherein the program further comprises instructions for stopping the treating of the semiconductor substrates in the at least one processing tool based on the first output.

12. The tool system of claim 10, further comprising the first processing tool.

13. The tool system of claim 10, wherein the program further comprises instructions to store the first neural network in the non-transitory memory.

14. The tool system of claim 10, wherein the program further comprises instructions to convert the process data of the first processing tool machine data into a plurality of images for training the first neural network, wherein each image of the plurality of images is formatted as a feature vector populated by values corresponding to a pixel value of each machine data variable within a time period.

15. The tool system of claim 10, wherein the process data is indicative of process conditions during treating the semiconductor substrates.

16. The tool system of claim 15, wherein the operational codes comprise alarm/warning conditions, tool state information, or tool usage information.

17. A method comprising:

initializing a neural network on a processor of a first machine learning system coupled to a first processing tool;

collecting first processing tool machine data from the first processing tool while treating semiconductor substrates, wherein the first processing tool machine data comprise process data mapped to operational codes associated with one or more discrete intervals of time during the treating, wherein the operational codes comprise information indicating a fault state of the first processing tool and a normal operation of the first processing tool;

training the neural network with the first processing tool machine data, the training being performed by including the information indicating the fault state of the first processing tool and the normal operation of the first processing tool;

saving the neural network to a memory of the first machine learning system; and implementing the first machine learning system on a second processing tool, including generating an output indicative of a fault of the second processing tool from the neural network, based, at least in part, on applying unmapped machine data from at least one processing tool.

18. The method of claim 17, wherein the process data is indicative of process conditions during treating the semiconductor substrates.

19. The method of claim 17, wherein the process data comprises in-situ measurement data during treating the semiconductor substrates.

20. The method of claim 17, wherein the operational codes comprise alarm/warning conditions, tool state information, or tool usage information.

\* \* \* \* \*